(12) United States Patent
Chen et al.

(10) Patent No.: US 7,002,209 B2
(45) Date of Patent: Feb. 21, 2006

(54) MOSFET STRUCTURE WITH HIGH MECHANICAL STRESS IN THE CHANNEL

(75) Inventors: Xiangdong Chen, Poughquag, NY (US); Dureseti Chidambarrao, Weston, CT (US); Oleg Gluschenkov, Poughkeepsie, NY (US); Brian Greene, Danbury, CT (US); Kern Rim, Yorktown Heights, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/851,830

(22) Filed: May 21, 2004

(65) Prior Publication Data
US 2005/0260808 A1 Nov. 24, 2005

(51) Int. Cl.
H01L 29/76 (2006.01)
H01L 29/94 (2006.01)
H01L 31/062 (2006.01)
H01L 31/113 (2006.01)
H01L 31/119 (2006.01)

(52) U.S. Cl. ............... 257/336; 257/365; 438/197
(58) Field of Classification Search ........... 438/197, 438/299, 300, 301, 305, 306, 307, 586; 257/336, 257/344, 349, 365, 377
See application file for complete search history.

(56) References Cited

U.S. PATENT DOCUMENTS 5,447,875 A * 9/1995 Moslehi ............... 438/303
6,214,709 B1 * 4/2001 Chen .................... 438/586
6,709,935 B1 * 3/2004 Yu ....................... 438/289
6,737,308 B1 * 5/2004 Kim ..................... 438/197
6,890,808 B1 * 5/2005 Chidambarrao et al. .... 438/199

OTHER PUBLICATIONS

Jeffrey A. Davis, et al., "Interconnect Limits on Gigascale Integration (GSI) in the 21st Century", *Proceedings of the IEEE*, vol. 89, No. 3, pp. 305-324 (2001).
"Grand Challenges", *The International Technology Roadmap For Semiconductors*, pp. 9-15 (2002).
Shinya Ito, et al. "Mechanical Stress Effect of Etch-Stop Nitride and its Impact on Deep Submicron Transistor Design", *IEEE Electron Devices Meeting*, 247-250 (2000).

* cited by examiner

Primary Examiner—Phuc T. Dang
(74) Attorney, Agent, or Firm—Scully, Scott, Murphy & Presser; Wan Yee Cheung (57) ABSTRACT

The present invention provides a semiconducting device including at least one gate region including a gate conductor located on a surface of a substrate, the substrate having an exposed surface adjacent the gate region; a silicide contact located adjacent the exposed surface; and a stress inducing liner located on the silicide contact, the exposed surface of the substrate adjacent to the gate region and the at least one gate region, wherein the stress inducing liner provides a stress to a device channel portion of the substrate underlying the gate region. The stress produced on the device channel is a longitudinal stress on the order of about 200 MPa to about 2000 MPa. The present invention also provides a method for forming the above-described semiconducting device.

20 Claims, 5 Drawing Sheets

MOSFET STRUCTURE WITH HIGH MECHANICAL STRESS IN THE CHANNEL

FIELD OF THE INVENTION

The present invention relates to semiconductor devices having enhanced electron and hole mobilities, and more particularly, to semiconductor devices that include a silicon (Si)-containing layer having enhanced electron and hole mobilities. The present invention also provides methods for forming such semiconductor devices.

BACKGROUND OF THE INVENTION

For more than three decades, the continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. A concise summary of near-term and long-term challenges to continued complementary metal oxide semiconductor (CMOS) scaling can be found in the "Grand Challenges" section of the 2002 Update of the International Technology Roadmap for Semiconductors (ITRS). A very thorough review of the device, material, circuit, and systems can be found in Proc. IEEE, Vol. 89, No. 3, March 2001, a special issue dedicated to the limits of semiconductor technology.

Since it has become increasingly difficult to improve MOSFETs and therefore CMOS performance through continued scaling, methods for improving performance without scaling have become critical. One approach for doing this is to increase carrier (electron and/or hole) mobilities. Increased carrier mobility can be obtained, for example, by introducing the appropriate stress into the Si lattice.

The application of stress changes the lattice dimensions of the silicon (Si)-containing substrate. By changing the lattice dimensions, the electronic band structure of the material is changed as well. This results in changes in carrier transport properties, which can be dramatic in certain cases. The application of stress can be used to enhance the performance of devices fabricated on the Si-containing substrates.

Compressive longitudinal stress along the channel increases drive current in p-type field effect transistors (pFETs) and decreases drive current in n-type field effect transistors (nFETs). Tensile longitudinal stress along the channel increases drive current in nFETs and decreases drive current in pFETs.

Figure 1:
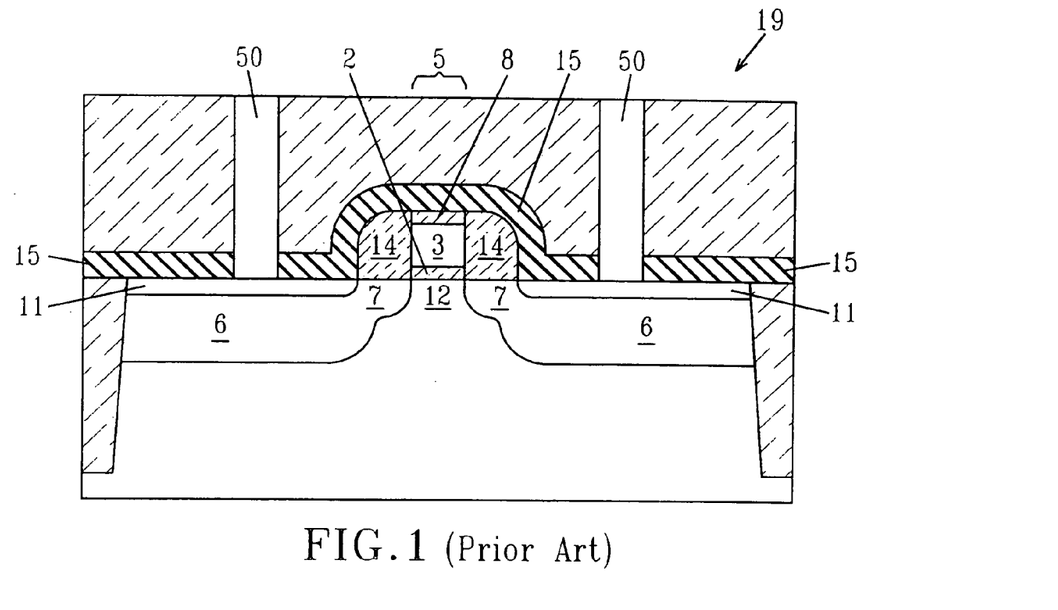
FIG. 1 is a pictorial representation (through a cross-sectional view) showing a prior FET incorporating a nitride liner deposited atop a gate region and atop the top surface of a planar substrate; note the nitride liner is not located directly atop an exposed surface of the substrate adjacent the gate region due to the presence of the permanent spacers.

Nitride liners positioned atop field effect transistors (FETs) have been proposed as a means to provide stress based device improvements. Referring to FIG. 1, a prior field effect transistor (FET) 19 is provided including a nitride liner 15 positioned on a gate region 5 having permanent spacers 14, in which the nitride liner 15 produces a stress on the device channel 12. The device channel 12 is located between source/drain regions 6 and source/drain extension regions 7. The source/drain regions 6 further comprise silicide regions 11. The gate region 5 includes a polysilicon gate 3 atop a gate dielectric 2. The gate region 5 further comprises a gate cap 8. The stress transfer in this prior FET 19 is limited since the nitride liner 15 is relatively far away from the gate 3 due to the presence of the permanent spacers 14. Typically, the channel stress produced by the nitride liner 15 in this prior art structure ranges from about 100 MPa to about 200 MPa.

One proposal for increasing the stress produced in the device channel 12 of the above described device is to increase the thickness of the nitride liner 15. In order to increase the stress produced in the device channel 12 in this approach by a magnitude of two, the thickness of the nitride liner 15 must also be increased by roughly a magnitude of two. This approach is unacceptable since it limits the scaling of the distance between the contact 50 and the gate conductor 3. Another proposal for increasing the stress produced within the device channel 12 is to increase the intrinsic stress within the nitride liner 15 itself. This approach is also unacceptable because it requires additional processing and has negative effects on the portions of the device in which a stress in not desired.

Further scaling of semiconducting devices requires that the stress levels produced within the substrate be controlled and that new methods be developed to increase the stress that can be produced.

SUMMARY

An object of the present invention is to provide a field effect transistor (FET) having a stress inducing liner that produces a compressive or tensile stress on the channel region of the device at a magnitude greater than previously known limits. This objective is achieved in the present invention by providing a stress inducing liner in close proximity to the gate region of the device. By "close proximity" it is meant that the stress inducing liner of the present invention is located within about 15 nm or less from the gate region; this range includes instances in which the stress inducing liner is in direct contact with the gate region. In the present invention, the stress inducing liner is positioned in closer proximity to the gate region than previously possible in prior FETs by removing or reducing the thickness of the sidewall spacers, or like structures, that are positioned adjacent to the gate region. By positioning the stress inducing liner in closer proximity to the gate region, the stress in the channel is increased which, in turn, can increase the device's performance. Broadly, the inventive semiconducting device comprises:

at least one gate region including a gate conductor located on a surface of a substrate, said substrate having an exposed surface adjacent to at least one gate region;

a silicide contact located adjacent to the exposed surface, said silicide contact is separated from said at least one gate region by the exposed surface; and a stress inducing liner located on said silicide contact, said exposed surface of the substrate adjacent to the at least one gate region and said at least one gate region, wherein the stress inducing liner provides a stress to a device channel portion of the substrate underlying the at least one gate region.

The stress inducing liner of the present invention comprises a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The stress inducing liner can have a thickness ranging from about 10 nm to about 100 nm. The stress inducing liner may provide a compressive stress in the device channel to improve pFET performance or provide a tensile stress in the device channel to improve nFET performance. In accordance with the present invention, the stress inducing liner is located in close proximity to the at least one gate region.

The gate region comprises a gate conductor atop a gate dielectric. The gate region may further comprise a gate cap atop the gate conductor. In one embodiment, thin sidewall spacers can be formed abutting the gate cap, gate conductor and the gate dielectric. The thin sidewall spacers can be positioned to separate the stress inducing liner from the gate conductor and protect the gate conductor and the gate dielectric during device processing. The thin sidewall spacers have a width ranging from about 1 nm to about 20 nm. The thin sidewall spacers may be omitted. In such an embodiment, the stress inducing liner is in direct contact with the gate conductor.

In accordance with the present invention, the device channel of the substrate is positioned below the gate region and the stress produced on the device channel region is a longitudinal stress on the order of about 200 MPa to about 2000 MPa.

In comparison to prior FETs having nitride liners atop a gate region and permanent spacers, as depicted in FIG. 1, the present invention provides an increase in device performance ranging from about 5% to about 50%.

Another aspect of the present invention is a method of forming the above-described semiconducting structure, which includes a stress inducing liner that provides a longitudinal stress within the portion of the substrate underlying the gate region; Broadly, the method of present invention comprises the steps of:

forming at least one gate region atop a substantially planar substrate, said gate region comprising a gate conductor;

forming a disposable spacer abutting the at least one gate region;

forming source/drain regions in the substrate;

forming a silicide region atop the source/drain regions aligned to the disposable spacer;

removing the disposable spacer; and depositing a stress inducing liner atop the gate region and the portion of the planar substrate adjacent to the gate region, wherein the stress inducing liner provides a stress to the portion of the substrate underlying the gate region.

The gate region may be formed by depositing a gate stack including a gate dielectric layer, a gate conductor layer, and an optional gate cap layer and then patterning the gate stack region using photolithography and etching.

In one embodiment, a thin sidewall spacer can be formed abutting at least the gate region on each sidewall thereof using conventional deposition or growth processes. The thin sidewall spacer is typically an oxide having a thickness ranging from about 1 nm to about 20 nm. The thin sidewall spacer may be omitted.

A disposable spacer is then formed abutting the at least one gate regions. When present, the thin sidewall spacer is positioned between the disposable spacer and the gate region. The disposable spacer offsets the subsequently formed source/drain regions and silicide region from the gate region. Following the formation of the disposable spacer, source/drain regions are formed in portions of the substrate adjacent to the gate region by ion implantation and annealing.

A silicide contact is then formed atop the surface of the substrate under which the source/drain regions are formed. Silicide does not form on the disposable spacers. Following the formation of the silicide contact, the disposable spacers are removed using a highly selective etch process. This exposes a surface of the substrate adjacent to the at least one gate region, which permits the subsequently formed stress inducing liner to be in close proximity to the gate region.

The stress inducing liner is then formed atop the gate region, the exposed surface of the substrate adjacent to the gate region and the silicide contact. In some embodiments, the stress inducing liner can contact the sidewalls of the gate conductor. When utilizing the thin sidewall spacer, the stress inducing liner is positioned on the thin sidewall spacer, wherein the thin sidewall spacer separates the stress inducing liner from the gate region. The stress inducing liner may be deposited under conditions that produce a compressive stress or a tensile stress.

By removing the disposable spacer prior to the formation of the stress inducing liner, the exposed surface area of the planar substrate separating each gate region is increased. Therefore, the deposition of the stress inducing liner and subsequent isolation layers can result in superior conformality than previously possible with prior forming methods. In the case where two or more devices (and therefore two or more gate electrodes) are in close proximity, the liner will have to fit into the space between the adjacent permanent spacers in the structures in prior art. This invention maximizes this space by eliminating much or all of the permanent spacers, and leads to improved conformality of the deposited liner.

DETAILED DESCRIPTION OF THE INVENTION

The present invention provides a field effect transistor (FET), and a method of forming thereof, comprising a gate structure on a semiconducting substrate, in which a longitudinal stress is applied to a portion of the semiconducting substrate underlying the gate region to increase the FET's performance. The present invention advantageously provides a longitudinal stress to the portion of the substrate underlying the gate region by forming a stress inducing liner positioned in close proximity to the gate region and atop a surface of the substrate adjacent to and planar with the portion of the substrate on which the gate region is formed.

The present invention is now discussed in more detail referring to the drawings that accompany the present application. In the accompanying drawings, like and/or corresponding elements are referred to by like reference numbers. In the drawings, a single gate region is shown and described. Despite this illustration, the present invention is not limited to a structure including a single gate region. Instead, a plurality of such gate regions is contemplated.

Figure 2:
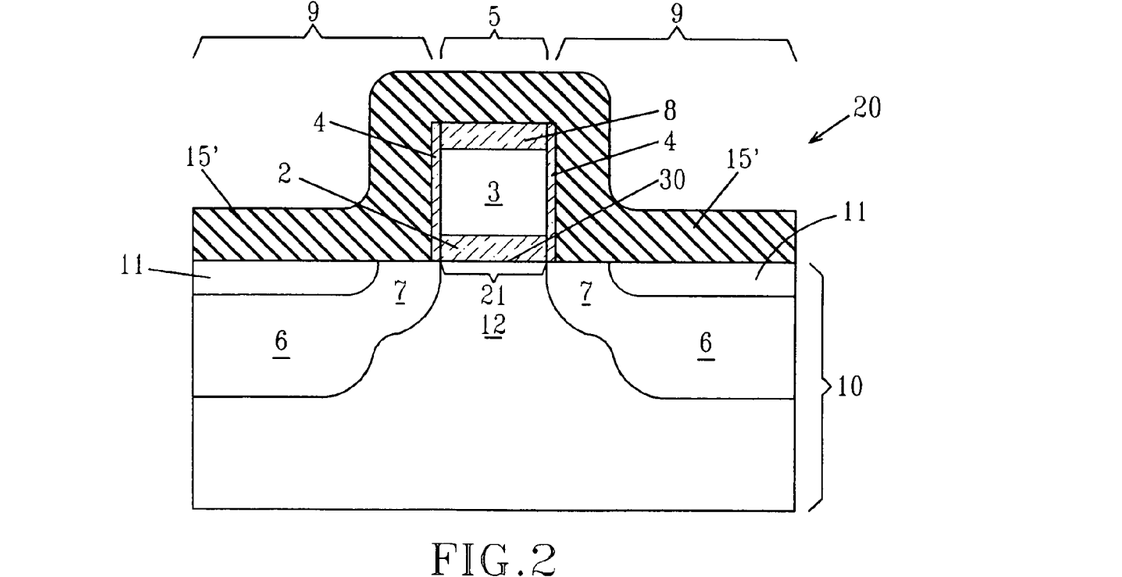
FIG. 2 is a pictorial representation (through a cross-sectional view) of one embodiment of the inventive semiconducting device including a stress inducing liner located in close proximity to the gate region.

Referring to FIG. 2, in one embodiment of the present invention, a field effect transistor (FET) 20 is provided, in which a longitudinal stress is produced in the device channel 12 of the substrate 10. The longitudinal stress in the device channel 12 of the FET 20 is provided by a stress inducing liner 15' positioned atop the gate region 5 and atop the exposed surface 9 of the substrate 10 adjacent to the gate region 5. The substrate 10 also comprises source/drain regions 6 and extension regions 7. The device channel 12 is positioned between the extension regions 7 and beneath the gate region 5. A silicide contact 11 is located on a portion of the surface of the substrate 10 overlying the source/drain regions 6. The silicide contact 11 is spaced apart from the gate region 5 by an exposed surface of the substrate 10, in which the extension regions 7 are located.

The gate region 5 comprises a gate conductor 3 atop a gate dielectric 2. The gate region 5 further comprises a gate cap 8, which is optional. The portion of the substrate 10 on which the gate region 5 is formed is hereafter referred to as the gate surface 21. Preferably, a thin sidewall spacer 4 abuts the gate region 5. The thin sidewall spacer 4 typically comprises an oxide, such as $SiO_2$, and has a thickness ranging from about 1 nm to about 20 nm. The thin sidewall spacer 4 may be omitted.

The stress inducing liner 15', preferably comprises $Si_3N_4$, and is preferably positioned atop the gate region 5, the thin sidewall spacer 4, and the exposed surface of the substrate 10 adjacent to the gate region 5. Alternatively, the stress inducing liner 15' directly contacts the sidewalls of the gate conductor 3 when the thin sidewall spacer 4 is omitted. The stress inducing liner 15' has a thickness ranging from about 40 nm to about 100 nm. The stress inducing liner 15' produces a longitudinal stress on the device channel 12 ranging from about 200 MPa to about 2000 MPa. Although the stress inducing liner 15' preferably comprises $Si_3N_4$, the stress inducing liner 15' may alternatively comprise an oxide, a doped oxide such as boron phosphate silicate glass, $Al_2O_3$, $HfO_2$, $ZrO_2$, HfSiO, other dielectric materials that are common to semiconductor processing or any combination thereof.

One advantage of the inventive FET 20, as depicted in FIG. 2, is that the stress inducing liner 15' is in closer proximity to the gate region 5 of the device than previously possible in prior FETs 19 and therefore achieves a greater stress within the device channel 12 than previously possible. The stress inducing liner of the present invention is brought in close proximity to the gate region by removing the permanent spacer 14 or like structures, that typically separate the nitride liner 15 from the gate region 5 in prior FETs 19, as depicted in FIG. 1. The relationship between the stress produced within the device channel and the thickness of the spacer separating the stress inducing liner from the gate region is now discussed in greater detail, with reference to the plot depicted in FIG. 3.

Figure 3:
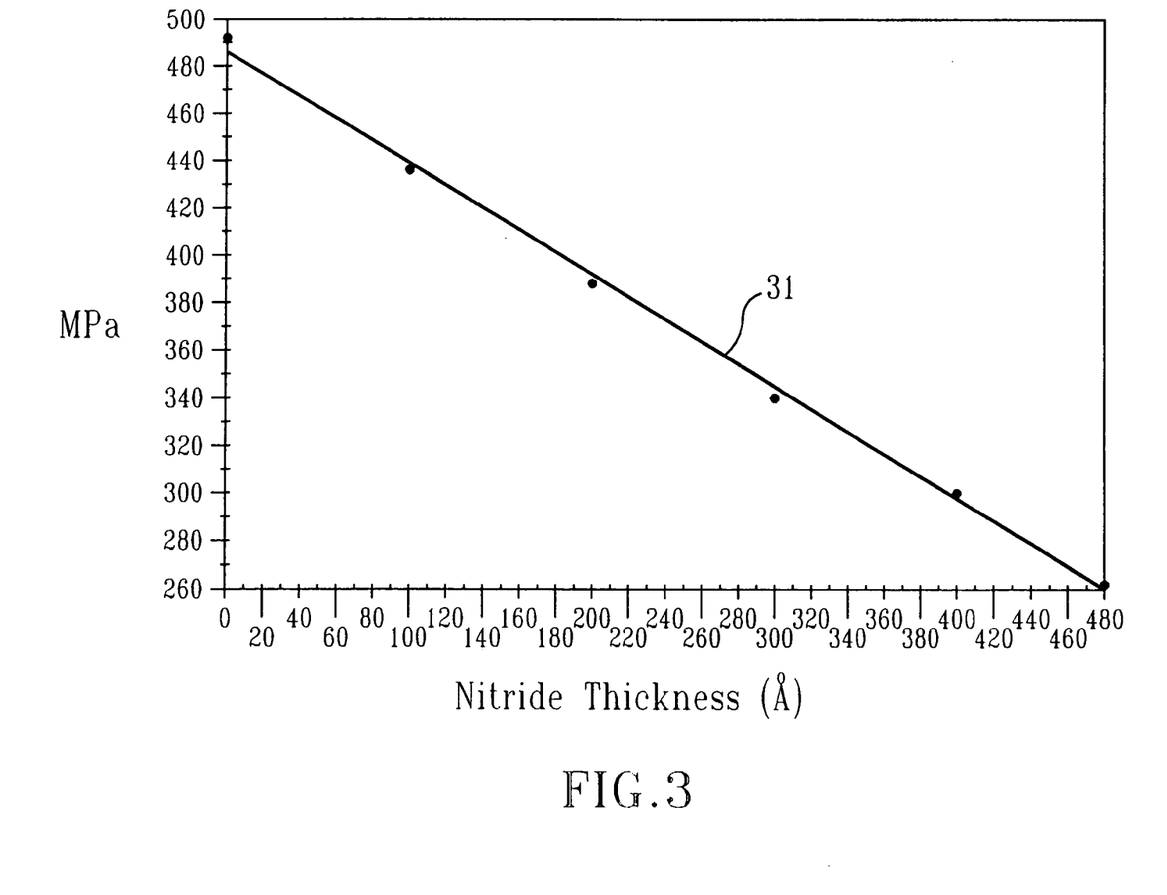
FIG. 3 is a plot of the internal stress within the device channel produced by the stress inducing liner versus the thickness of the sidewall spacer adjacent to the gate region, where the internal stress is measured at the interface of the stress induced liner, the gate dielectric, and the substrate.

Referring to FIG. 3, a stress line 31 depicts the stress produced within the device channel of an FET by a compressive $Si_3N_4$ stress inducing liner having a thickness on the order of about 50 nm, where the compressive stress is on the order of about 1.7 GPa. The width of the gate region on which the stress inducing liner is positioned is on the order of about 45 nm. An oxide spacer is positioned on each side of the gate poly, where the thickness of the oxide is on the order of about 20 nm. The y-axis represents the stress produced within the device channel and is measured in MPa. The x-axis represents the thickness of the spacer adjacent to the gate region and is measured in Å. The stress produced within the device channel 12 is measured at the interface 30 of the gate oxide and the substrate in the center of the device channel 12, as depicted in FIG. 2.

As illustrated in FIG. 3, the stress produced within the device channel is plotted verses the thickness of a gate region sidewall spacer, wherein the thickness of the gate sidewall spacer ranges from about 0 nm to about 50 nm. The stress produced by the stress inducing liner on the device channel when the sidewall spacer thickness is 20 nm or less represents the stress produced within the device channel 12 of the inventive FET 20, as depicted in FIG. 2. The stress produced by the stress inducing liner on the device channel when the spacer thickness is greater than 200 Å represents the stress produced within the device channel 12 of a prior FET 19, as depicted in FIG. 1.

The stress line 31, as shown in FIG. 3, indicates that the longitudinal stress produced in the device channel by the stress inducing liner ranges from approximately 480 MPa, when the spacer width is approximately 10 nm, to approximately 390 MPa, when the spacer width is approximately 20 nm. The stress line 31 further indicates that as the thickness of the spacer separating the stress inducing layer from the gate region is increased to greater than 20 nm the stress produced within the device channel further decreases with increasing spacer width. The width of the spacer is measured from the bottom portion of the spacer that is in contact with the underlying substrate.

The inventive FET having a stress inducing liner in close proximity (20 nm or less) to the gate region produces an increased stress at the device channel that was not previously possible in prior FETs having a permanent spacer that separates the stress inducing liner from the gate region. It is noted that the above examples are provided for illustrative purposes only and do not limit the scope of the invention.

Figure 4:
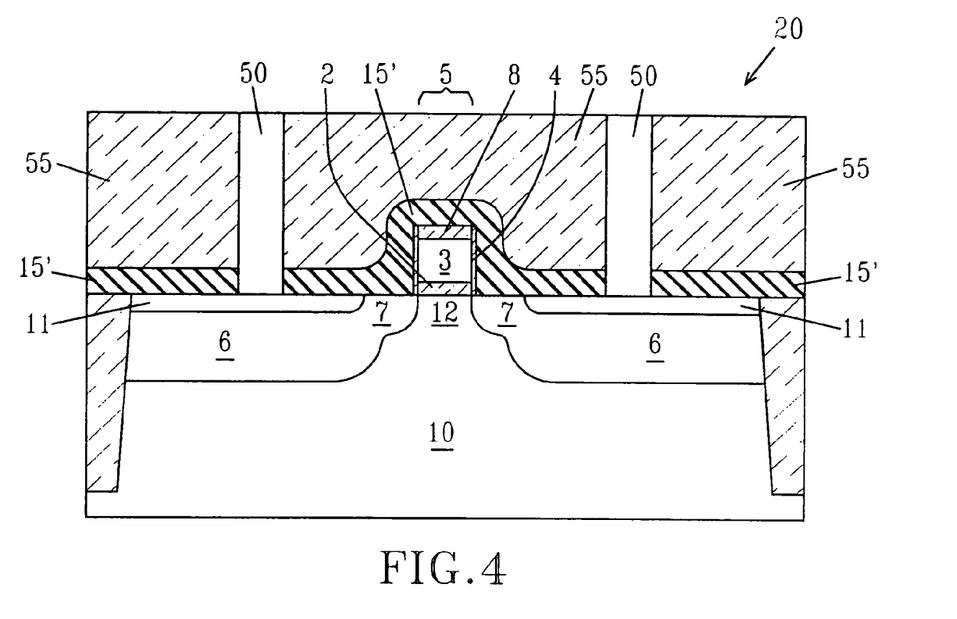
FIG. 4 is a pictorial representation (through a cross-sectional view) of the semiconducting device depicted in FIG. 2 further comprising a blanket dielectric layer and contacts to the silicide contact.

Referring to FIG. 4, another advantage of the inventive FET 20 is that removing the permanent spacer employed in prior FETs reduces the capacitance formed between the gate region 5 and the metal contacts 50 to the silicide contact 11. Typically, the permanent spacers employed in prior FETs comprise a nitride material, such as $Si_3N_4$. Nitride materials typically have a high dielectric constant. The term "high dielectric constant" denotes a dielectric constant (k) greater than 4.0. By omitting the high dielectric constant permanent spacer utilized in prior FETs, the inventive FET 20 reduces the capacitance between the gate region 5 and the metal contact 50. The structure depicted in FIG. 4 includes the entire structure depicted in FIG. 2 and further comprises a blanket dielectric layer 55, i.e., interconnect dielectric, and metal contacts 50. The method for forming the inventive FET 20 is now described in greater detail referring to FIGS. 5–10.

Figure 5:
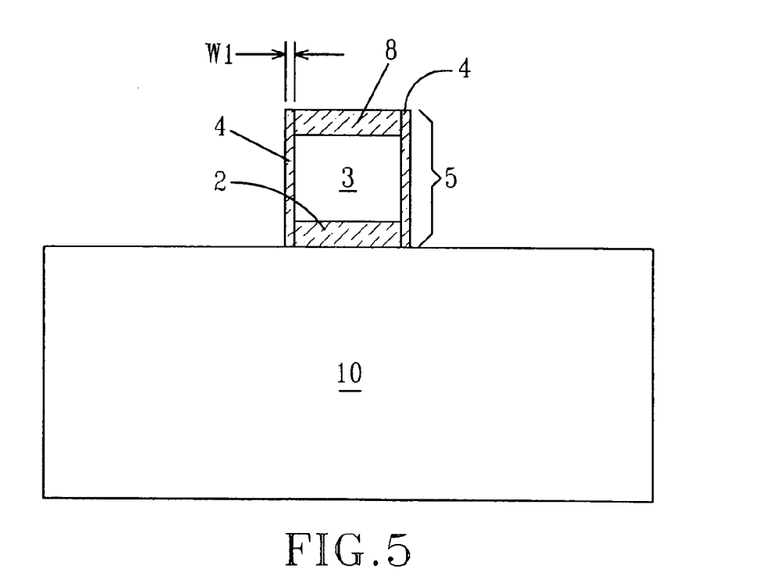
FIGS. 5–9 are pictorial representations (through cross-sectional views) showing the basic processing steps that are employed to produce the inventive semiconducting structure.

Referring to FIG. 5, a gate region 5 is formed atop a substrate 10 utilizing conventional methods including deposition and lithography. Specifically, a gate stack is first provided atop the substrate 10 by depositing a gate dielectric layer and then a gate conductor layer using conventional forming methods, such as chemical vapor deposition.

The substrate 10 includes, but is not limited to: any semiconducting material such conventional Si-containing materials, GaAs, InAs and other like semiconductors. Si-containing materials include, but are not limited to: Si, bulk Si, single crystal Si, polycrystalline Si, SiGe, amorphous Si, silicon-on-insulator substrates (SOI), SiGe-on-insulator (SGOI), strained-silicon-on-insulator, annealed poly Si, and poly Si line structures.

When the substrate 10 is a silicon-on-insulator (SOI) or SiGe-on-insulator (SGOI) substrate, the thickness of the Si-containing layer atop the buried insulating layer can have a thickness on the order of 10 nm or greater. The SOI or SGOI substrate may be fabricated using techniques that are well known to those skilled in the art. For example, the SOI or SGOI substrate may be fabricated using a thermal bonding process, or alternatively be fabricated by an ion implantation process, which is referred to in the art as separation by ion implantation of oxygen (SIMOX).

Still referring to FIG. 5, the gate dielectric layer, formed atop the substrate 10, is typically an oxide material and is generally greater than 0.8 nm thick, and preferably from about 1.0 nm to about 6.0 nm thick. The gate dielectric layer may also be composed of a nitride, oxynitride, or a combination thereof. The gate dielectric layer is formed using conventional techniques such as chemical vapor deposition (CVD), atomic layer CVD (ALCVD), pulsed CVD, plasma assisted CVD, sputtering, and chemical solution deposition, or alternatively, the gate dielectric layer is formed by a thermal growing process, which may include oxidation, oxynitridation, nitridation, and/or plasma or radical treatment. Suitable examples of oxides that can be employed as the gate dielectric 2 include, but are not limited to: $SiO_2$, $Al_2O_3$, $ZrO_2$, $HfO_2$, $Ta_2O_3$, $TiO_2$, perovskite-type oxides and combinations and multi-layers thereof. The gate dielectric layer is subsequently etched to form the gate dielectric 2.

The gate conductor layer can be comprised of polysilicon or an appropriate metal. The gate conductor layer is formed atop the gate dielectric layer utilizing a conventional deposition process such as CVD and sputtering. Preferably, the gate conductor layer comprises doped polysilicon. The polysilicon dopant can be elements from group III-A or a group V of the Periodic Table of Elements. The dopant may be introduced during deposition of the gate conductor layer or following subsequent patterning and etching of the gate conductor 3.

A gate cap 8 is then optionally formed atop the gate stack using deposition, photolithography, and highly selective etching. In one example, a gate cap layer is first deposited atop the gate stack and then patterned using photolithography and etching. The gate cap layer may comprise dielectrics that can be deposited by chemical vapor deposition (CVD) and related methods. Typically, gate cap 8 compositions include silicon oxides, silicon carbides, silicon nitrides, silicon carbonitrides, etc. Spin-on dielectrics may also be utilized as the gate cap 8 including but not limited too: silsequioxanes, siloxanes, and boron phosphate silicate glass (BPSG).

The gate cap layer is then patterned using photolithography. Specifically, a pattern is produced by applying a photoresist to the surface to be patterned; exposing the photoresist to a pattern of radiation; and then developing the pattern into the photoresist utilizing a conventional resist developer. Once the patterning of the photoresist is completed, the sections covered by the photoresist are protected, while the exposed regions are removed using a selective etching process that removes the unprotected regions of the gate cap layer forming the gate cap 8.

Following the formation of the gate cap 8, the gate stack is then etched by a directional etch process, such as reactive ion etching, having high selectivity for removing the material of the gate conductor layer and the gate dielectric layer without substantially etching the gate cap 8 and the substrate 10. The resultant gate region 5 includes a gate conductor 3 positioned atop a gate dielectric 2.

In a preferred embodiment, following the formation of the gate region 5, a thin sidewall spacer 4 is formed abutting and protecting the gate region 5 sidewalls. Preferably, the thin sidewall spacer 4 is an oxide, such as $SiO_2$. The thin sidewall spacer width W1 ranges from about 1 nm to about 20 nm, preferably being about 3 nm. Forming processes such as deposition or thermal growing may produce the thin sidewall spacer 4. Preferably, the thin sidewall spacer 4 is formed by deposition processes such as chemical vapor deposition (CVD), low-pressure chemical vapor deposition (LPCVD), rapid thermal chemical vapor deposition (RTCVD), or plasma enhanced chemical vapor deposition (PECVD) in combination with a directional reactive ion etch. Alternatively, the thin sidewall spacer 4 may be formed using a low temperature thermal oxidation of the gate region 5 in combination with a directional reactive ion etching. The thin sidewall spacer 4 ensures that the subsequently formed stress inducing liner does not directly contact the gate conductor 3. The thin sidewall spacer 4 may be omitted.

Figure 6:
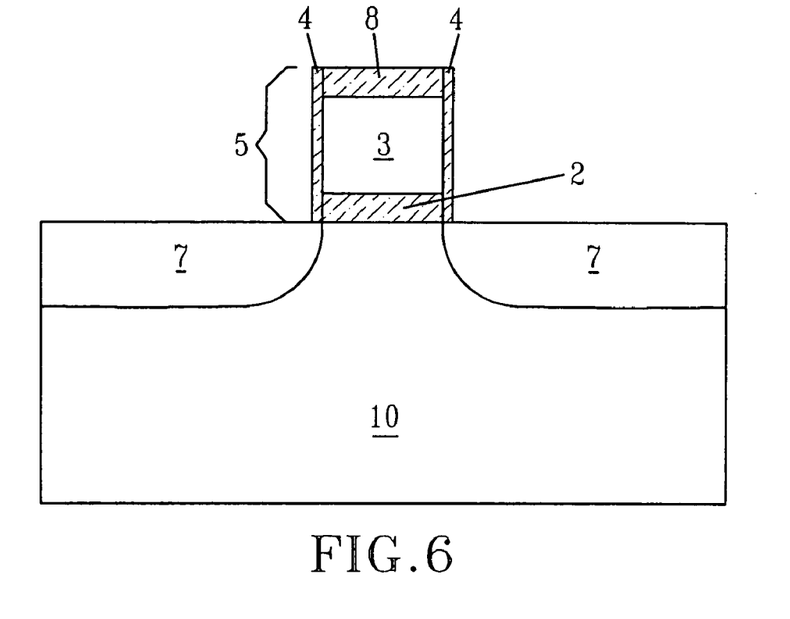

Referring to FIG. 6, source/drain extension regions 7 are then formed in substrate 10 and partially extend under the gate region 5. Source/drain extension regions 7 are formed via ion implantation and comprise a combination of normally incident and angled implants to form the desired grading in the extensions. PFET devices are produced within Si-containing substrates by doping the source/drain extension regions 7 with elements from group V of the Periodic Table of Elements. NFET devices are produced within Si-containing substrates by doping the source/drain extension regions 7 with elements from group III-A of the Periodic Table of Elements. Halo regions can also be formed beneath the source/drain extension regions 7 using an angled ion implantation and a dopant having a conductivity type opposite the source/drain extension regions 7.

Figure 7:
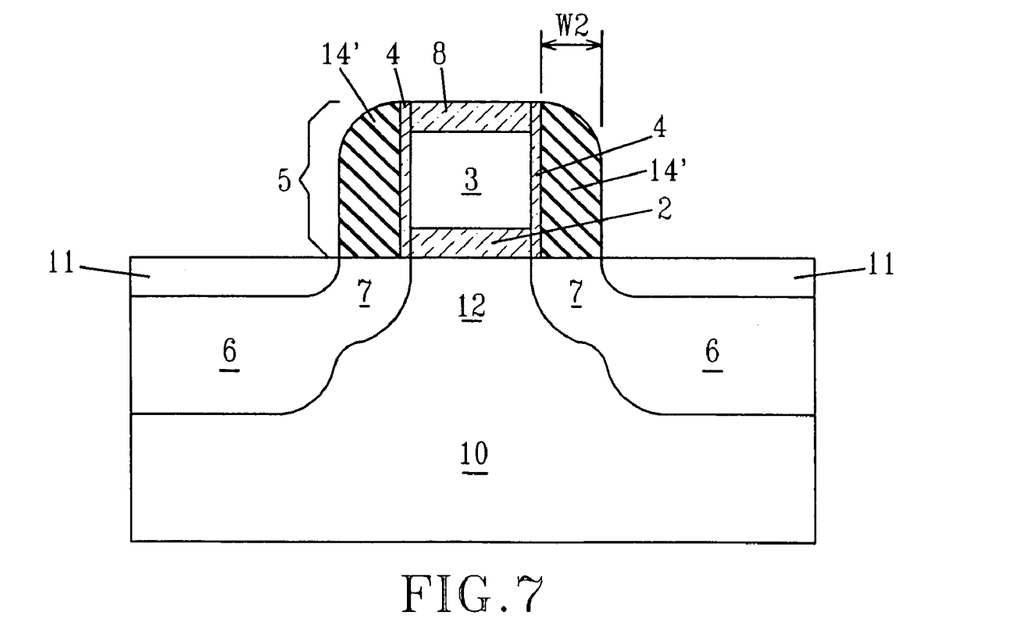

Referring to FIG. 7, following source/drain extension region 7 implants, a disposable spacer 14' is formed abutting the exterior surface of the thin sidewall spacer 4. In an alternative embodiment, the disposable spacer 14' may be formed abutting the gate conductor 3 by omitting the thin sidewall spacer 4. Disposable spacer 14' is formed using conventional deposition and etch processes that are well known in the art. The disposable spacer 14' has a disposable spacer width W2 that is greater than the thin sidewall spacer width W 1. The disposable spacer width W2 ranges from about 10 nm to about 60 nm. The disposable spacer 14' can be comprised of a dielectric material such as a nitride or a combination of oxide and nitride materials, most preferably being $Si_3N_4$.

Following disposable spacer 14' formation, a higher energy ion implant is conducted to form deep source/drain regions 6. These implants are conducted at a higher energy and higher concentration of dopant than the source/drain extension region 7 implant. The deep source/drain regions 6 are typically doped with a dopant type consistent with the source/drain extension regions 7.

Following deep source/drain region 6 formation, the source/drain region 6 and gate region 5 are activated by activation annealing using conventional processes such as, but not limited to: rapid thermal annealing, furnace annealing, flash lamp annealing or laser annealing. Activation anneal is conducted at a temperature ranging from about 850° C. to about 1350° C.

Still referring to FIG. 7, in a next process step silicide regions 11 are then formed atop the source/drain regions 6. Silicide formation typically requires depositing a metal layer onto the surface of a Si-containing material or wafer. The metal layer may be formed using a conventional process including, but not limited to: chemical vapor deposition (CVD), plasma-assisted CVD, high-density chemical vapor deposition (HDCVD), plating, sputtering, evaporation and chemical solution deposition. Metals deposited for silicide formation include Ta, Ti, W, Pt, Co, Ni, and combinations thereof, most preferably being Co or Ni. Following deposition, the structure is then subjected to an annealing step using conventional processes such as, but not limited to: rapid thermal annealing. During thermal annealing, the deposited metal reacts with Si forming a metal silicide.

Figure 8:
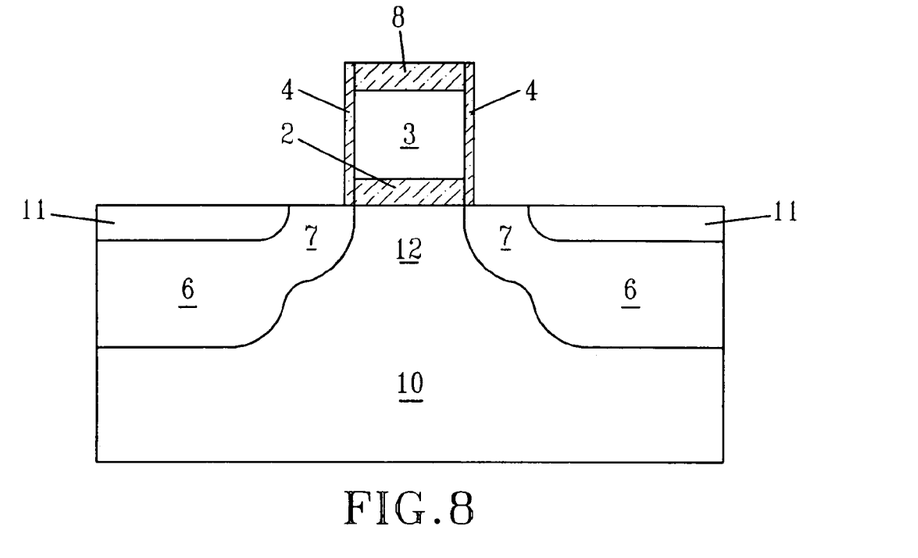

Referring to FIG. 8, the disposable spacer 14' is then removed prior to the deposition of the stress inducing liner. By removing the disposable spacer 14' prior to the formation of the stress inducing liner, the stress inducing liner is positioned in closer proximity to the sidewalls of the gate region 5 than previously possible in prior FETs. Reducing the distance between the stress inducing liner 15' and the gate region 5, increases the stress produced in the device channel 12.

The disposable spacer 14' may be removed using a highly selective etching process that removes the disposable spacer 14' without substantially etching the substrate 10, the gate cap 8, the silicide contact 1, and the gate region 5. Preferably, the disposable spacer 14' is removed using an isotropic etch. Alternatively, the disposable spacer 14' may be removed using an anisotropic etch method. In the preferred embodiment, the thin sidewall spacer 4 can protect the gate dielectric 2 and gate conductor 3 during the disposable spacer 14' removal process. The removal of the disposable spacer 14 exposes a surface of the substrate 10 adjacent to the gate surface 21. The exposed surface is labeled with reference numeral 9.

Figure 9:
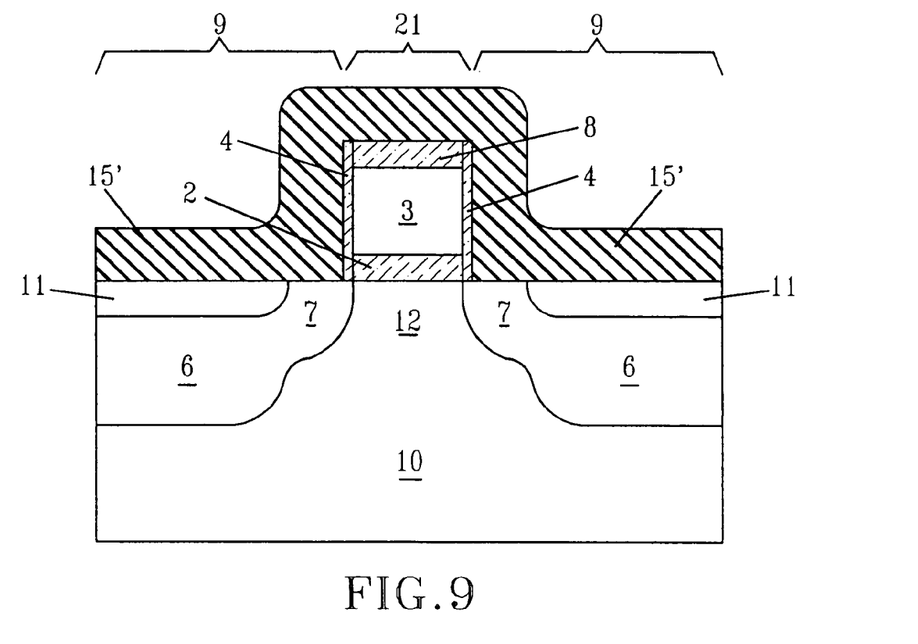

Referring to FIG. 9, a stress inducing liner 15' is then deposited atop the entire structure depicted in FIG. 8. Specifically, the stress inducing liner 15' is formed atop the gate region 5, the silicide contact 11 and the exposed surface 9 of the substrate 10 adjacent to the gate region 5. The adjacent gate surface 9 of the substrate 10 is coplanar to the surface 21 of the substrate 10 on which the gate region 5 is formed.

In the preferred embodiment, the stress inducing liner 15' is separated from the gate conductor 3 by the thin sidewall spacer 4. Alternatively, by omitting the thin sidewall spacer 4, the stress inducing liner 15' can directly contact the sidewalls of the gate conductor 3. The stress inducing liner 15' produces a longitudinal stress on the portion of the substrate 10 underlying the gate region 5. The stress may range from about 200 MPa to about 2000 MPa.

The stress inducing liner 15' may comprise a nitride, an oxide, a doped oxide such as boron phosphate silicate glass, $Al_2O_3$, $HfO_2$, $ZrO_2$, HfSiO, other dielectric materials that are common to semiconductor processing or any combination thereof. The stress inducing liner 15' may have a thickness ranging from about 10 nm to about 100 nm, preferably being about 50 nm. The stress inducing liner 15' may be deposited by plasma enhanced chemical vapor deposition (PECVD) or rapid thermal chemical vapor deposition (RTCVD). The stress produced by the stress inducing liners 15' may be in a compressive or tensile state.

Preferably, the stress inducing liner 15' comprises a nitride, such as $Si_3N_4$. Modifying the process conditions for forming nitride stress inducing liners 15' can control whether the state of stress produced in the device channel 12 is tensile or compressive. For example, plasma enhanced chemical vapor deposition (PECVD) can provide nitride stress inducing liners 15' having a compressive or tensile internal stress. The stress state of the nitride stress including liners 15' deposited by PECVD can be controlled by changing the deposition conditions to alter the reaction rate within the deposition chamber. More specifically, the stress state of the deposited nitride stress inducing liner 15' may be set by changing the deposition conditions such as: $SiH_4/N_2$/He gas flow rate, pressure, RF power, and electrode gap.

In another example, rapid thermal chemical vapor deposition (RTCVD) can provide nitride stress inducing liners 15' having an internal tensile stress. The magnitude of the internal tensile stress produced within the nitride stress inducing liner 15' deposited by RTCVD can be controlled by changing the deposition conditions. More specifically, the magnitude of the tensile stress within the nitride stress inducing liner 15' may be set by changing deposition conditions such as: precursor composition, precursor flow rate and temperature.

Following the formation of the stress inducing liner 15', a layer of dielectric material 55 is blanket deposited atop the entire structure depicted in FIG. 9 and planarized. The blanket dielectric 55 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, a—C:H). Additional choices for the blanket dielectric include: any of the aforementioned materials in porous form, or in a form that changes during processing to or from being porous and/or permeable to being non-porous and/or non-permeable.

The blanket dielectric 55 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The blanket dielectric 55 is then patterned and etched using conventional photolithography and etching to form vias to the silicide contact 11. Following via formation, metal contacts 50 to the silicide contact 11 are formed by depositing a conductive metal into the via holes using conventional processing, such as sputtering or plating. The conductive metal may include, but is not limited to: tungsten, copper, aluminum, silver, gold, and alloys thereof. The resultant structure following the formation of the blanket dielectric 55 and the contacts 50 is depicted in FIG. 4.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconducting device comprising:
at least one gate region including a gate conductor located on a surface of a substrate, said substrate having an exposed surface adjacent to said at least one gate region;
a silicide contact located adjacent to said exposed surface, said silicide contact is separated from said at least one gate region by said exposed surface; and
a stress inducing liner located on said silicide contact, said exposed surface of said substrate adjacent said silicide contact and said at least one gate region and atop said at least one gate region, wherein said stress inducing liner provides a stress to a device channel portion of said substrate underlying said at least one gate region.

2. The structure of claim 1 wherein said gate region comprises a gate conductor atop a gate dielectric.

3. The structure of claim 1 wherein said stress inducing liner comprises oxides, doped oxides, nitrides, $Al_2O_3$, $HfO_2$, $ZrO_2$, HfSiO or combinations thereof.

4. The structure of claim 1 wherein said stress inducing liner has a thickness ranging from about 10 nm to about 100 nm.

5. The structure of claim 1 wherein said stress is produced in said device channel portion of said substrate at a depth of about 5 nm or less below said gate region.

6. The structure of claim 1 further comprising a spacer separating said stress-inducing liner from sidewalls of said gate conductor, said spacer having a thickness of less than about 20 nm.

7. The structure of claim 6 wherein said spacer comprises an oxide.

8. The structure of claim 1 wherein said stress on said device channel portion, is a longitudinal stress ranging from about 200 MPa to about 2000 MPa.

9. The structure of claim 1 wherein said stress inducing liner is separated from each gate sidewall of said gate region by a horizontal dimension of less than about 20 nm.

10. A method of forming a gate structure comprising:
forming a gate region atop a substantially planar substrate, said gate region comprising a gate conductor;
forming disposable spacers abutting said at least one gate region;
forming source/drain regions in said substrate;
forming a silicide region atop said source/drain regions aligned to said disposable spacer,
removing said disposable spacers to expose a surface portion of said substrate between said silicide contact and said gate region; and
depositing a stress inducing liner atop said gate region and said exposed surface portions of said substrate adjacent to said gate region, wherein said stress inducing liner provides a stress to a portion of said substrate underlying said gate region.

11. The method of claim 10 wherein said disposable spacer has a width ranging from about 20 nm to about 60 nm.

12. The method of claim 10 further comprising forming a sidewall spacer between said gate region and said disposable spacer, wherein said sidewall spacer has a thickness of less than about 20 nm.

13. The method of claim 12 wherein said sidewall spacer comprises an oxide.

14. The method of claim 12 wherein said sidewall spacer is formed by chemical vapor deposition, plasma enhanced chemical vapor deposition, low pressure chemical vapor deposition, rapid thermal chemical vapor deposition or thermal growth.

15. The method of claim 12 wherein said removing said disposable spacer comprises an isotropic or anisotropic etch process having high selectivity to removing said disposable spacer without removing said sidewall spacer.

16. The method of claim 10 wherein said stress inducing liner comprises oxides, nitrides, doped oxides, or combinations thereof.

17. The method of claim 10 wherein said stress inducing liner is deposited under conditions that produce a compressive stress.

18. The method of claim 10 wherein said stress inducing liner is deposited under conditions that produce a compressive stress.

19. The method of claim 10 wherein said stress inducing liner has a thickness ranging from about 20 nm to about 1000 nm.

20. A semiconducting device comprising:
at least one gate region including a gate conductor located on a surface of a substrate, said substrate having an exposed surface adjacent to said at least one gate region;
a silicide contact located adjacent to said exposed surface, said silicide contact is separated from said at least one gate region by said exposed surface; and
a stress inducing liner located on said silicide contact, said exposed surface of said substrate adjacent said silicide contact and said at least one gate region and atop said at least one gate region, wherein said stress inducing liner provides a longitudinal stress of about 200 MPa to about 200 MPa to a device channel portion of said substrate underlying said at least one gate region.

* * * * *

UNITED STATES PATENT AND TRADEMARK OFFICE
CERTIFICATE OF CORRECTION

PATENT NO. : 7,002,209 B2 Page 1 of 1
APPLICATION NO. : 10/851830
DATED : February 21, 2006
INVENTOR(S) : Xiangdong Chen et al.

It is certified that error appears in the above-identified patent and that said Letters Patent is hereby corrected as shown below:

Column 3, Line 29:
"gate region;" should read -- gate region. --

Column 9, Line 28:
"contact 1," should read -- contact 11, --

Column 11, Line 46, Claim 10:
"spacer," should read -- spacer; --

Signed and Sealed this

Twelfth Day of December, 2006

JON W. DUDAS
*Director of the United States Patent and Trademark Office*